(12) United States Patent
Saitou (10) Patent No.: US 7,859,810 B2
(45) Date of Patent: Dec. 28, 2010

(54) PHOTOCOUPLER

(75) Inventor: Hisami Saitou, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 309 days.

(21) Appl. No.: 12/208,910

(22) Filed: Sep. 11, 2008

(65) Prior Publication Data

US 2009/0073626 A1 Mar. 19, 2009

(30) Foreign Application Priority Data

Sep. 14, 2007 (JP) .............................. 2007-239546

(51) Int. Cl.
*H02H 9/00* (2006.01)
(52) U.S. Cl. ........................ 361/91.6; 361/56
(58) Field of Classification Search ............. 361/56, 361/91.6, 111; 250/551
See application file for complete search history.

(56) References Cited

FOREIGN PATENT DOCUMENTS

| JP | 07-086902 | 3/1995 |
|---|---|---|
| JP | 3367718 | 11/2002 |
| JP | 3367718 | * 1/2003 |

OTHER PUBLICATIONS

Japanese Office Action for 2007-239546 mailed on Nov. 9, 2009.

* cited by examiner

*Primary Examiner*—Danny Nguyen
(74) *Attorney, Agent, or Firm*—Turocy & Watson, LLP (57) ABSTRACT

A photocoupler includes a light emitting device, a drive circuit; a clamp circuit and a light receiving section. For an input voltage to the input terminal being within a range between a first voltage and a second voltage, the photocoupler is allowed to enter an operation mode in which the drive circuit, in response to the digital signal inputted thereto, drives the light emitting device to convert the digital signal to the optical signal, and the electrical signal is externally outputted from the light receiving section. For an input voltage to the input terminal being outside the range between the first voltage and the second voltage, the photocoupler is allowed to enter an inspection mode in which the drive circuit stops driving the light emitting device, the first transistor of the clamp circuit is turned on, and a current generally equal or proportional to a clamp current of the clamp circuit is supplied to the light emitting device so that characteristics of the light emitting device can be measured.

20 Claims, 8 Drawing Sheets

PHOTOCOUPLER

CROSS-REFERENCE TO RELATED APPLICATIONS

This application is based upon and claims the benefit of priority from the prior Japanese Patent Application No. 2007-239546, filed on Sep. 14, 2007; the entire contents of which are incorporated herein by reference.

BACKGROUND OF THE INVENTION

1. Field of the Invention
This invention relates to a photocoupler.
2. Background Art
A photocoupler can transmit signals between units with their power supply systems insulated from each other, and is required to transmit and receive a large amount of control signals and digital signals, such as on a bus connecting between the units. To construct such a signal transmission system, a compact, lightweight photocoupler having a small number of terminals is needed.

In a photocoupler, an input electrical signal is converted to an optical signal by a semiconductor light emitting device. The photocoupler often includes a drive circuit for driving the semiconductor light emitting device. In general, a semiconductor light emitting device has a wide range of characteristic distribution, and temperature variation also occurs in the characteristics. If the characteristics of the semiconductor light emitting device packaged in a photocoupler can be inspected without being affected by the drive circuit, the operating margin can be accurately defined, and the reliability is easily ensured.

Japanese Patent No. 3367718 discloses a technique for inspecting a semiconductor light emitting device without increasing the number of terminals. In this technique, the inspection mode is set to a region in which the power supply voltage is lower than the guaranteed operating range, and the signal input is converted to a current input to the semiconductor light emitting device for inspection. However, this technique has some problems. For example, the inspection mode is entered during the rising and falling of the power supply voltage. Furthermore, the operating range of the inspection mode is narrow at a low power supply voltage.

SUMMARY OF THE INVENTION

According to an aspect of the invention, there is provided a photocoupler including: a light emitting device; a drive circuit connected to a power supply terminal, an input terminal, and a ground terminal, and configured to drive the light emitting device in accordance with a digital signal inputted to the input terminal and cause the light emitting device to output an optical signal; a clamp circuit including a first transistor connected to the input terminal; and a light receiving section configured to convert the optical signal to an electrical signal for output, for an input voltage to the input terminal being within a range between a first voltage and a second voltage, the photocoupler being allowed to enter an operation mode in which the drive circuit, in response to the digital signal inputted thereto, drives the light emitting device to convert the digital signal to the optical signal, and the electrical signal is externally outputted from the light receiving section, and for an input voltage to the input terminal being outside the range between the first voltage and the second voltage, the photocoupler being allowed to enter an inspection mode in which the drive circuit stops driving the light emitting device, the first transistor of the clamp circuit is turned on, and a current generally equal or proportional to a clamp current of the clamp circuit is supplied to the light emitting device so that characteristics of the light emitting device can be measured.

According to an aspect of the invention, there is provided a photocoupler including: a light emitting device; a drive circuit connected to a power supply terminal, an input terminal, and a ground terminal, and configured to drive the light emitting device in accordance with a digital signal inputted to the input terminal and cause the light emitting device to output an optical signal; a clamp circuit having a first transistor connected to the input terminal, and a current mirror circuit made of a second and third transistors to supply with a polarity-inverted current to the light emitting diode, the first transistor and the second transistor connected in series; and a light receiving section configured to convert the optical signal to an electrical signal for output, for an input voltage to the input terminal being within a range between a first voltage and a second voltage, the photocoupler being allowed to enter an operation mode in which the drive circuit, in response to the digital signal inputted thereto, drives the light emitting device to convert the digital signal to the optical signal, and the electrical signal is externally outputted from the light receiving section, and for an input voltage to the input terminal being outside the range between the first voltage and the second voltage, the photocoupler being allowed to enter an inspection mode in which the drive circuit stops driving the light emitting device and a current generally equal or proportional to a clamp current of the clamp circuit is supplied to the light emitting device through the current mirror circuit by turning on the first transistor so that characteristics of the light emitting device can be measured.

According to an aspect of the invention, there is provided a photocoupler including: a light emitting device; a drive circuit connected to a power supply terminal, an input terminal, and a ground terminal, and configured to drive the light emitting device in accordance with a digital signal inputted to the input terminal and cause the light emitting device to output an optical signal; a clamp circuit having a first transistor connected to the input terminal, and allowed to be set higher than zero and in a range lower than a forward voltage between a base and an emitter; and a light receiving section configured to convert the optical signal to an electrical signal for output, for an input voltage to the input terminal being within a range between a first voltage and a second voltage, the photocoupler being allowed to enter an operation mode in which the drive circuit, in response to the digital signal inputted thereto, drives the light emitting device to convert the digital signal to the optical signal, and the electrical signal is externally outputted from the light receiving section, and for an input voltage to the input terminal being outside the range between the first voltage and the second voltage, the photocoupler being allowed to enter an inspection mode in which the drive circuit stops driving the light emitting device, the first transistor is turned on, and a clamp current of the clamp circuit is supplied to the light emitting device so that characteristics of the light emitting device can be measured.

DETAILED DESCRIPTION OF THE INVENTION

Embodiments of the invention will now be illustrated with reference to the drawings.

Figure 1:
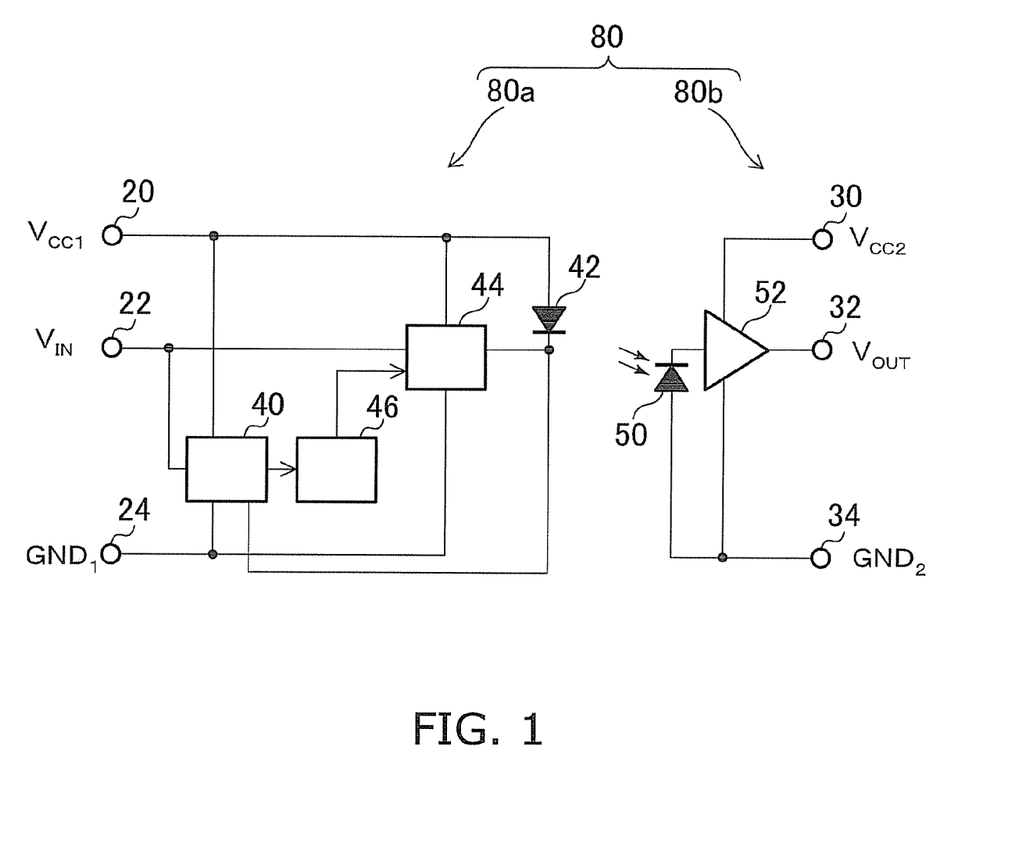
FIG. 1 is a block diagram of a photocoupler according to a first embodiment.

FIG. 1 is a block diagram for describing a photocoupler according to a first embodiment of the invention. The photocoupler 80 includes a light emitting section 80a and a light receiving section 80b. The light emitting section 80a includes a VCC1 terminal 20 to which a power supply voltage (hereinafter VCC1) is applied, a VIN terminal 22 to which an input voltage (hereinafter VIN) is inputted, a ground (hereinafter GND1) terminal 24, a light emitting device 42 made of semiconductor, a clamp circuit 40, a drive circuit 44, and a drive stop circuit 46. Here, GND1 is the ground of the system or device. The light receiving section 80b includes a VCC2 terminal 30 to which a power supply voltage (hereinafter VCC2) is applied, a VOUT terminal 32 from which an output voltage (hereinafter VOUT) is outputted, a ground (hereinafter GND2) terminal 34, a photodiode 50, and a light receiving circuit 52.

A digital signal inputted to the VIN terminal 22 causes the drive circuit 44 to turn on/off the light emitting device 42 in accordance with the high/low level of the digital signal, and is converted to an optical signal. The optical signal is converted by the photodiode 50 to a current, which is amplified and shaped back into a digital signal corresponding to the ON/OFF of the optical signal by the light receiving circuit 52, and outputted from the VOUT terminal 32. This is the operation mode of the photocoupler 80. If the input voltage VIN of the digital signal is illustratively within the voltage range between VCC1 and GND1, good coherence with the other electronic circuits constituting the system or device is achieved. Hence, the voltage of the digital signal is configured to include at least the range between GND1 (e.g., zero) and VCC1.

On the other hand, the operating voltage of the clamp circuit 40 is set outside the input voltage range of the digital signal. When the clamp circuit 40 is activated, the inspection mode is entered. In the inspection mode, the current flowing from the drive circuit 44 to the light emitting device 42 is turned off, and a current generally equal or proportional to the clamp current ICL flowing into the clamp circuit 40 is supplied to the light emitting device 42 so that analog current characteristics such as current sensitivity of the light emitting device 42 can be measured.

In this case, for example, when a voltage not less than the operating voltage preset to the clamp circuit 40 is inputted to the VIN terminal 22, the drive stop circuit 46 detects the preset operating voltage, stops the operation of the drive circuit 44, externally drives the light emitting device 42 at an arbitrary current, and measures its analog operating characteristics such as current sensitivity.

Figure 2:
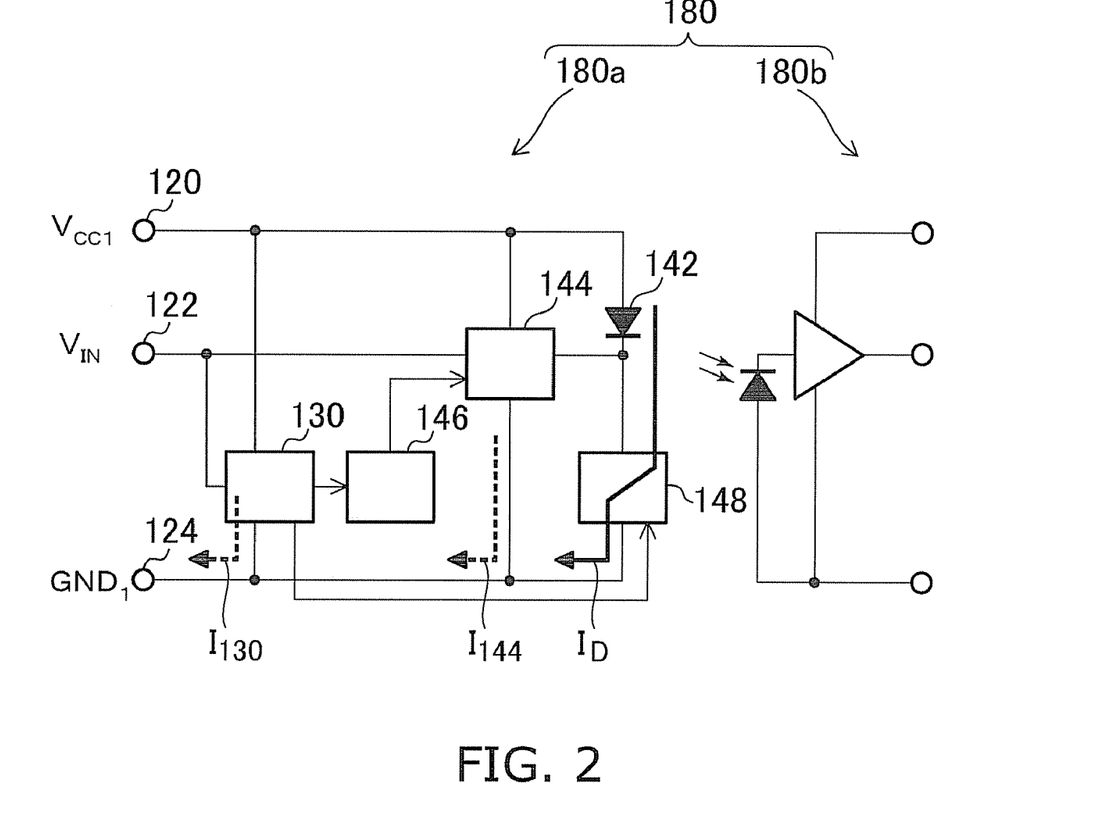
FIG. 2 is a block diagram of a photocoupler according to a comparative example.

FIG. 2 is a block diagram of a photocoupler according to a comparative example. The photocoupler 180 includes a light emitting section 180a and a light receiving section 180b. The light emitting section 180a includes a VCC1 terminal 120, a VIN terminal 122, a GND1 terminal 124, a voltage detection circuit 130, a drive circuit 144, a drive stop circuit 146, and a current bypass circuit 148. In this comparative example, in the case where the power supply voltage VCC1 of the VCC1 terminal 120 is illustratively within the guaranteed operating range of the photocoupler 180, the digital signal from the VIN terminal 122 is transmitted through the drive circuit 144 to the light emitting device 142. The optical signal from the light emitting device 142 is converted to an electrical signal by the light receiving section 180b, which serves as a digital output of the photocoupler 180.

On the other hand, when VCC1 is low and falls short of the guaranteed operating range, the inspection mode is entered, in which the drive stop circuit 146 and the current bypass circuit 148 are turned on by the input voltage at the VCC1 terminal 120. This turns off the drive circuit 144, and the current ID flowing through the light emitting device 142 is supplied by the current bypass circuit 148. In the comparative example, the inspection mode is determined by the power supply voltage. Because the inspection mode is necessarily entered in the rising process of the power supply, an unintended voltage is produced to the output. Furthermore, in the state of the photocoupler incorporated in a device or system, the power supply voltage cannot be controlled, which makes inspection difficult. In contrast, in this embodiment, normally, the input voltage transitions between the power supply voltage and the ground terminal voltage, and hence the inspection mode is not entered. Furthermore, the inspection mode can be easily entered simply by controlling the input voltage to the VIN terminal 22.

The light emitting device 42 is made of a lamination of compound semiconductors and emits visible to infrared light. The process for manufacturing such a light emitting device 42 is difficult to control. Thus, the light emitting device 42 has large variation in device characteristics and large characteristics variation with temperature, and may undergo degradation due to long-term continuous operation. Furthermore, its sensitivity varies with the optical transmission efficiency. Hence, it is important to accurately measure the light emitting device 42 incorporated in the photocoupler 80.

In this embodiment, in the inspection mode, the current flowing through the clamp circuit 40 is controlled by the voltage at the VIN terminal 22. Typically, the VIN terminal 22 has a very high impedance. The current flowing through the circuit in the process of turning off the drive circuit 44 can be eliminated. Hence, the current flowing through the clamp circuit 40 can be equal to the current flowing through the VIN terminal 22. Thus, the current ICL of the clamp circuit 40 can be accurately measured by measuring the current flowing through the VIN terminal 22.

More specifically, the current flowing through the VIN terminal 22 can be measured without newly providing a terminal for the inspection mode. A current generally equal or proportional to the clamp current ICL flowing through the clamp circuit 40 is supplied to the light emitting device 42 so that analog characteristics such as current sensitivity of the light emitting device 42 can be measured. Thus, it can be accurately estimated whether the operating margin for the photocoupler 80 in the operating state can be maintained, which facilitates reliability improvement.

Figure 3:
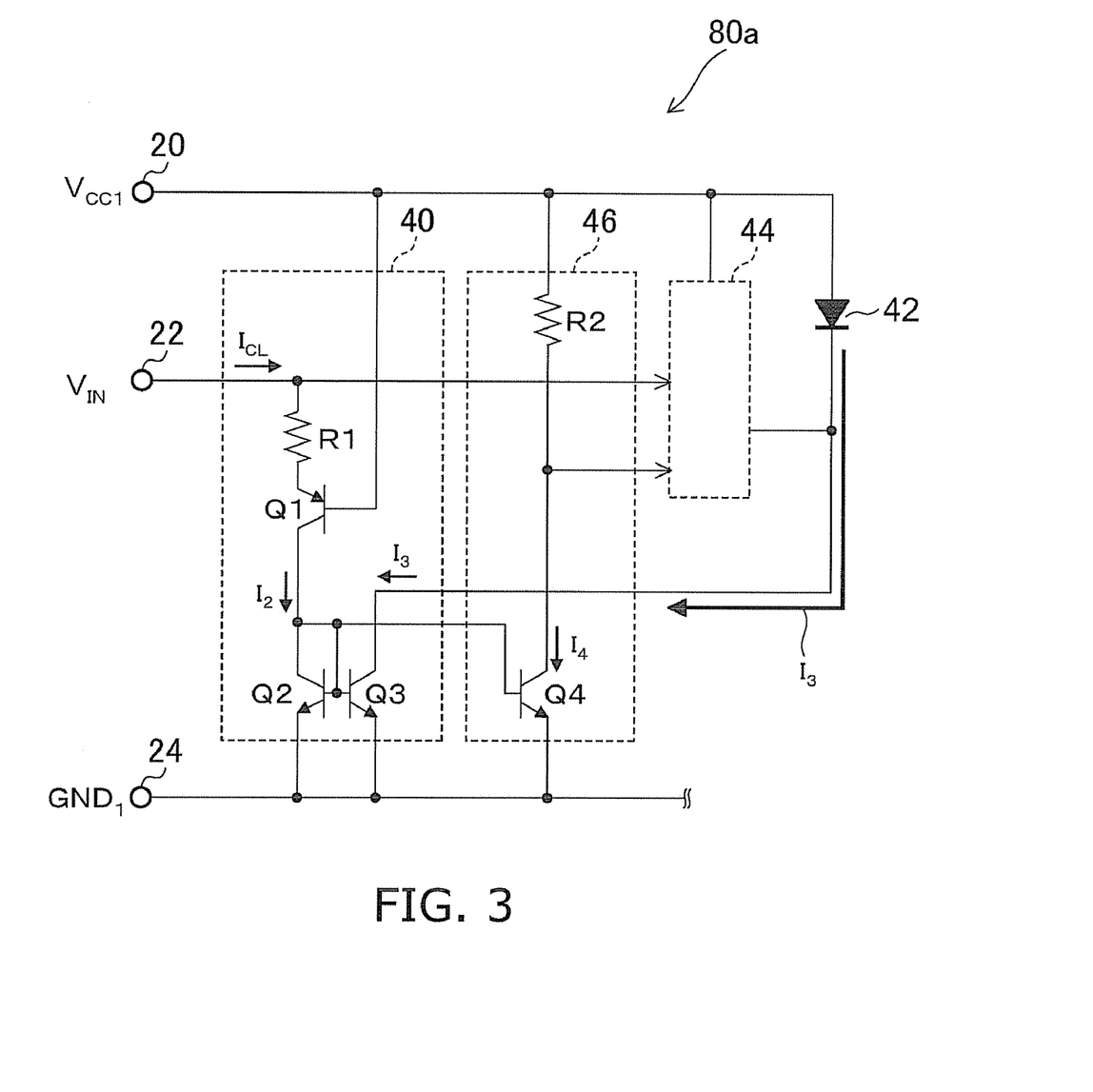
FIG. 3 is a circuit diagram of the photocoupler according to the first embodiment.

FIG. 3 is a circuit diagram of the photocoupler according to the first embodiment. However, the circuit is not limited to FIG. 3. In the case of VIN−VCC1<VF (where VF is the base-emitter forward voltage of the transistor Q1), Q1 is turned off, and the photocoupler 80 is in the operation mode.

A digital signal inputted to the VIN terminal 22 is applied through the drive circuit 44 to the light emitting device 42, converted therein to an optical signal, and converted back to a digital signal in the light receiving section 80b.

The clamp circuit 40 includes transistors Q1, Q2, and Q3, and a resistor R1. In the case of VIN−VCC1≧VF, Q1 is turned on, and a clamp current ICL starts to flow into the clamp circuit 40. Q2, Q3, and Q4 constitute a current mirror circuit, and currents I2, I3, and I4 start to flow therein, respectively, simultaneously with the turning on of Q1. That is, the photocoupler 80 enters the inspection mode.

Here, the drive stop circuit 46 includes a resistor R2 and Q4 placed between the VCC1 terminal 20 and the GND1 terminal 24. The voltage drop across the resistor R2 causes the output voltage of Q4 to decrease. Thus, the drive stop circuit 46 detects the start of the inspection mode, stops the operation of the drive circuit, and stops supplying a current to the light emitting device 42.

In FIG. 3, the collector of Q3 is connected to the cathode of the light emitting device 42 so that a current I3 generally equal or proportional to the clamp current ICL flowing through the clamp circuit 40 can be supplied to the light emitting device 42. In this case, the current I3 supplied to the light emitting device 42 does not pass through the drive circuit 44, and hence can be accurately measured.

Figure 4:
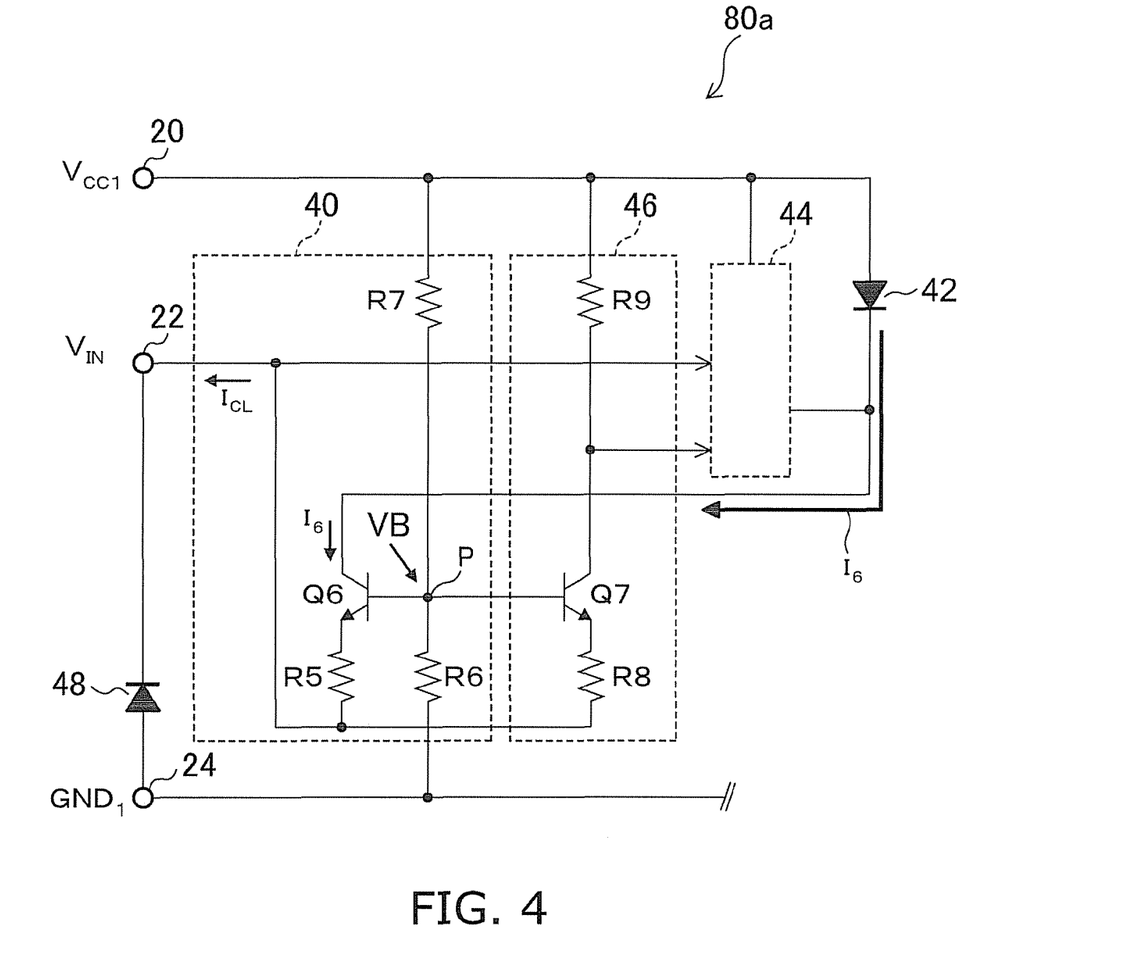
FIG. 4 is a circuit diagram of the photocoupler according to a second embodiment.

FIG. 4 is a circuit diagram of the photocoupler according to a second embodiment. Its block diagram can be represented by FIG. 1. In this embodiment, the clamp circuit 40 is set to a potential lower than GND1. For example, in the case of clamping at (GND1 potential −500 mV), the potential VB at point P is set by division with resistors R6 and R7. More specifically, if VF is 700 mV and VB is set to 200 mV, then transistors Q6 and Q7 are turned on at (GND1 potential −500 mV), a current flows therethrough, the voltage across resistor R9 drops, and the output voltage of Q7 decreases.

Furthermore, the drive stop circuit 46 detects the inspection mode and stops the operation of the drive circuit 44. The collector of Q6 is connected to the cathode of the light emitting device 42, and I6 flows therethrough. If the current flowing through Q7 is sufficiently small, the current I6 flowing through the light emitting device 42 is generally equal to ICL. Thus, the sensitivity and the like of the light emitting device 42 can be measured without the intermediary of the drive circuit 44.

Overvoltage falling by VF or more is diverted through an ESD (electrostatic discharge) protection diode 48 to protect Q6 and Q7. Thus, typically, in the case where an ESD protection diode 48 or a parasitic device of the internal circuit is interposed between the VIN terminal 22 and the GND1 terminal 24, it is impractical to configure the clamp circuit 40 to operate at a voltage that differs by the forward voltage or more compared with the GND1 terminal 24, at which voltage these devices operate.

More specifically, the input voltage VIN satisfying GND1>VIN>GND1−VF is preferably set as the clamp operating voltage for the inspection mode. In this case, it is preferable to set the bias VB of Q6 so that clamping occurs at a voltage immediately before the ESD protection diode 48 is activated. In the case where the ESD protection diode 48 is not used, the condition is GND1>VIN. The means for setting the operating voltage of the clamp circuit 40 is not limited to the ESD protection diode 48. It can be an ESD protection circuit having a desired operating voltage, or a Zener diode.

In FIG. 4, the potential VB at point P is set by division with resistors R6 and R7 between the voltage of the power supply terminal and the voltage of the ground terminal. However, the potential VB can be set by resistors dividing pn junction forward voltage VF and by shifting voltage of pn junction forward voltage VF.

Figure 5:
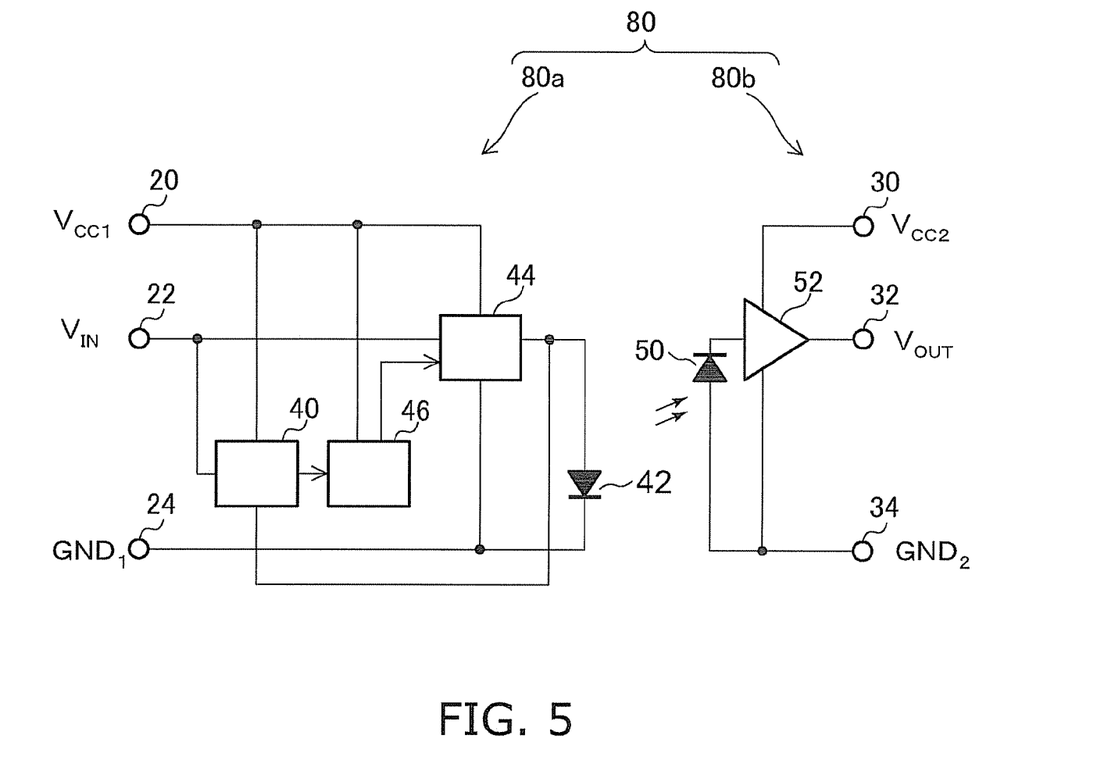
FIG. 5 is a block diagram of a photocoupler according to a third embodiment.
Figure 6:
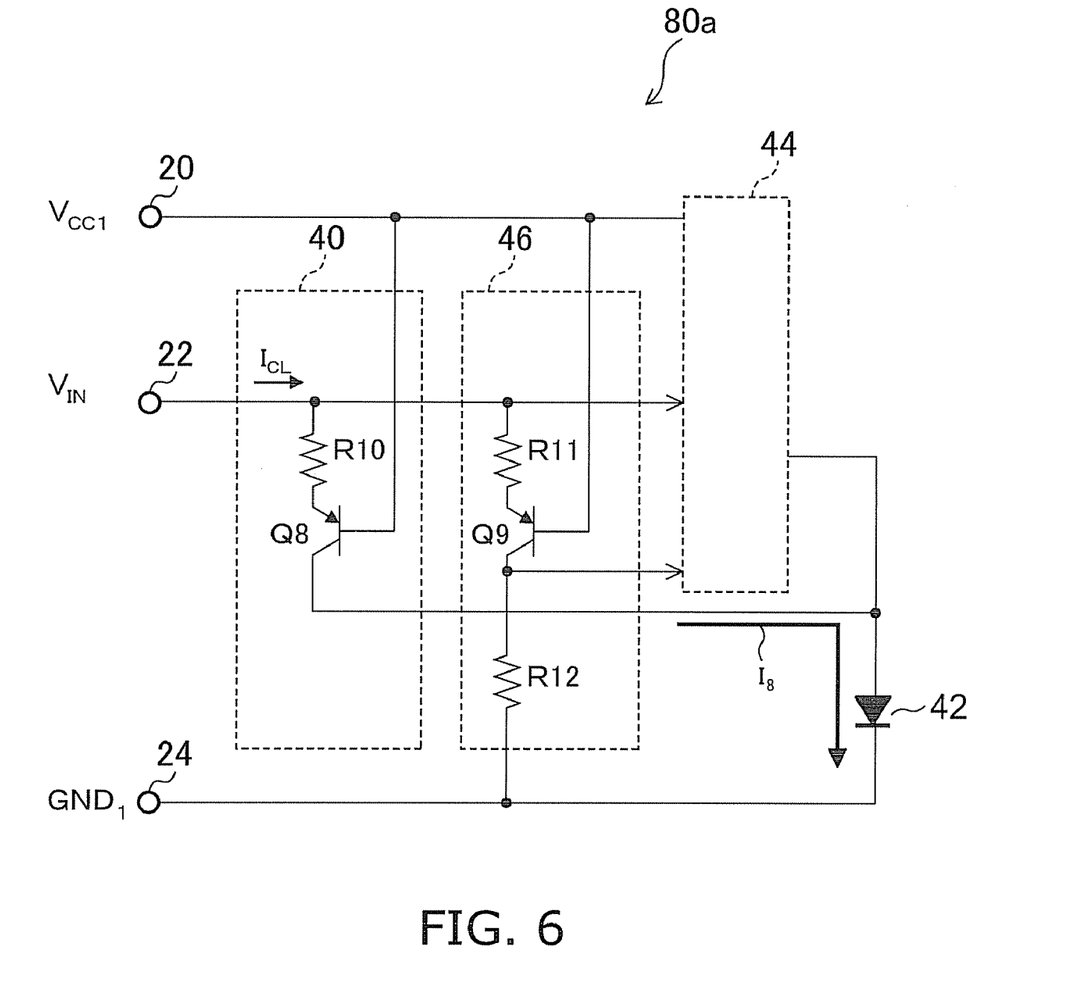
FIG. 6 is a circuit diagram of the photocoupler according to the third embodiment.

FIG. 5 is a block diagram showing a third embodiment, and FIG. 6 is a circuit diagram thereof. As in this embodiment, it is also often the case that the light emitting device 42 is placed and driven on the GND side.

In FIG. 6, when VIN is lower than VCC1, the drive circuit 44 detects the operation mode and drives the light emitting device 42. On the other hand, when VIN is higher than VCC1 by VF, transistors Q8 and Q9 are turned on, and a current flows therethrough. The voltage drop across R12 causes the output voltage of Q9 to increase. Thus, the inspection mode is detected, and the operation of the drive circuit 44 is stopped. If the current flowing through Q9 is sufficiently small, the clamp current ICL is generally equal to the collector current I8 flowing through Q8. Thus, the light emitting device 42 is driven, and the analog operating characteristics such as current sensitivity of the light emitting device 42 can be accurately measured.

Figure 8:
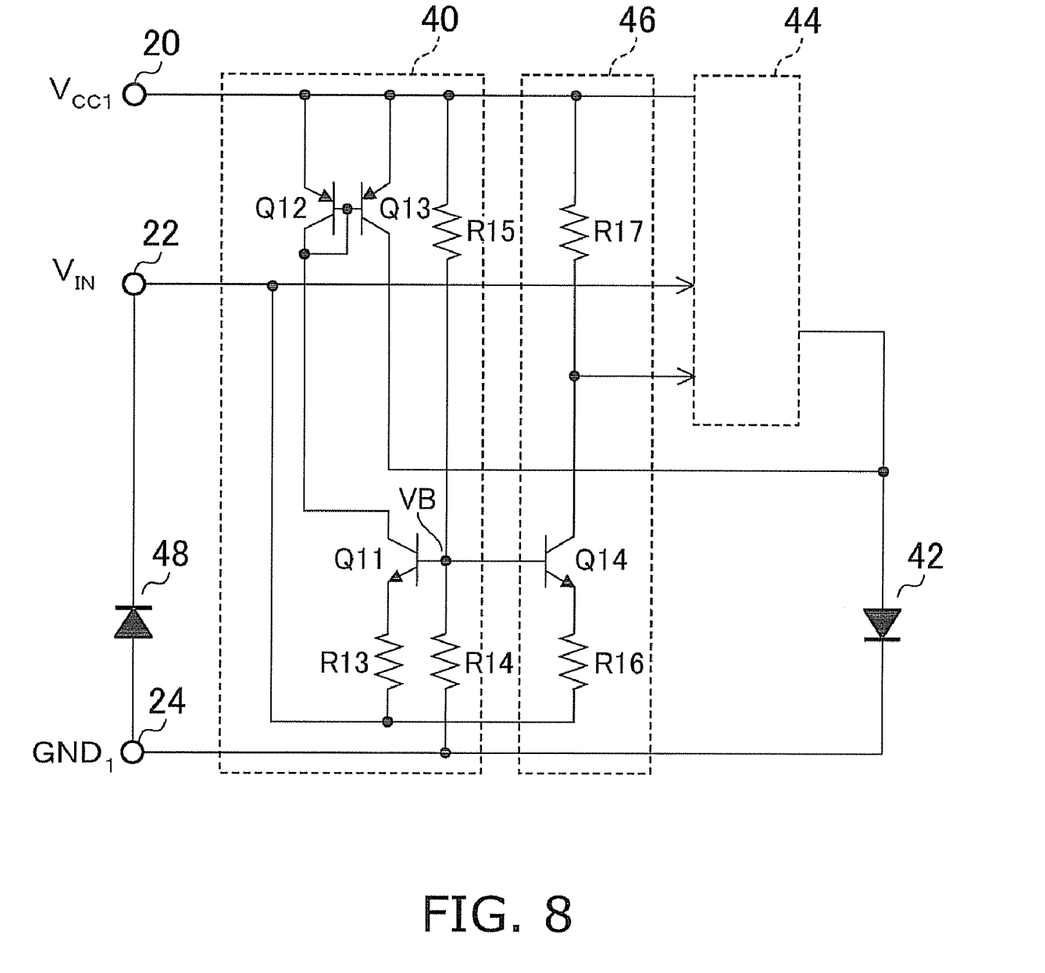
FIG. 8 is a circuit diagram of the photocoupler according to a fourth embodiment.

FIG. 8 is a circuit diagram showing a fourth embodiment.

In this embodiment, the light emitting device 42 is placed on the GND1 side and the clamp circuit 40 is set to a potential lower than GND1. The clamp circuit 40 includes a transistor Q11 (first transistor), Q12, Q13, a resistor R13, a resistor R14 and a resistor R15. Q12 and Q13 constitute the current mirror circuit, and Q12 is turned on almost simultaneously with the turning on of Q11 and a current is supplied to the light emitting device 42 through Q13. Furthermore, the drive stop circuit 46 has Q14 capable of being turned on almost simultaneously with Q11. The output voltage of Q14 decreasing by turning on is inputted to the drive circuit 44 to stop driving the light emitting device 42. It is noted that a base voltage of Q11 and Q14 can be set by division with series resistors R14, R15 between the power supply voltage Vcc1 and the ground terminal voltage GND1. Thus, when the input voltage VIN is GND1+VB−VF or less, Q11 is turned on to stop the operation of the drive circuit 44, and the inspection mode can be entered. Moreover, if VIN<Vcc1, the operation mode can be entered.

Figure 7:
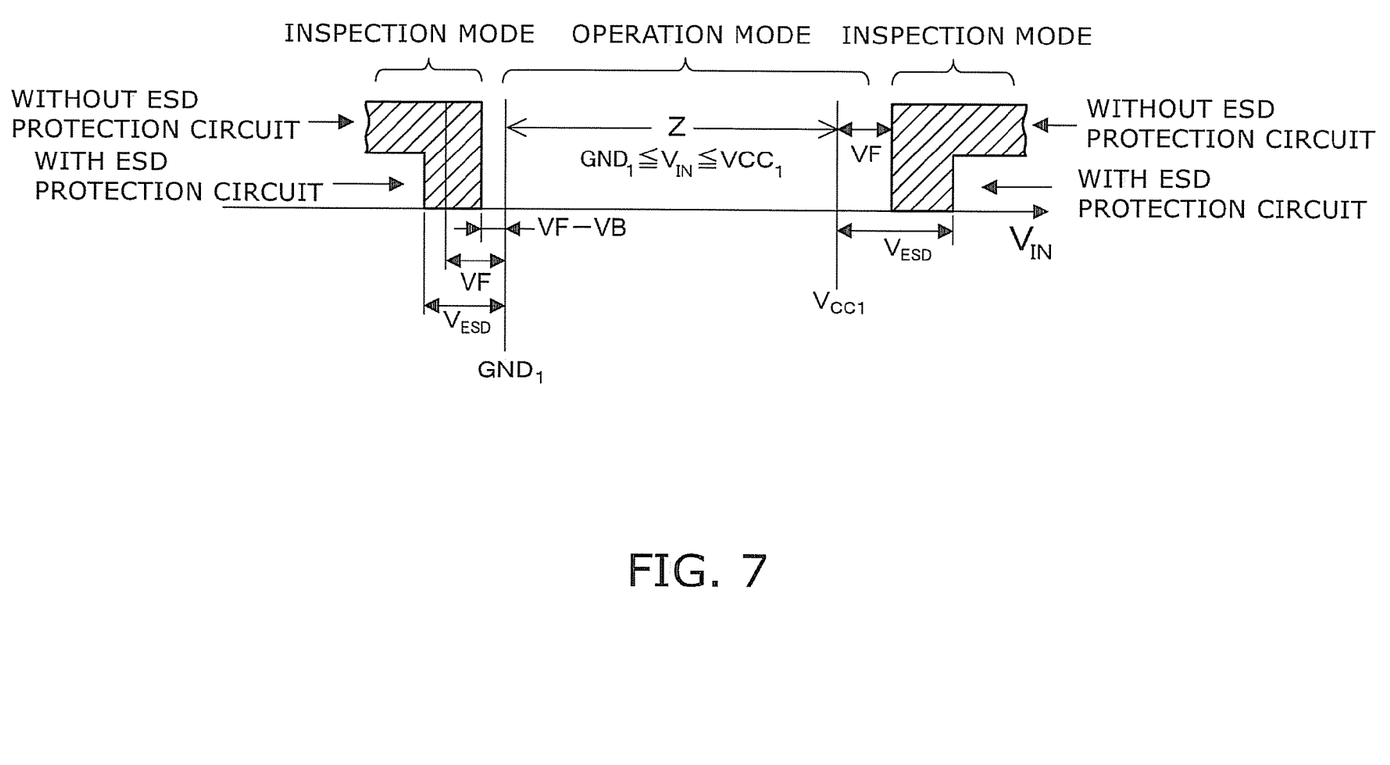
FIG. 7 shows the relationship between VIN and the operation or inspection mode.

FIG. 7 shows the relationship between VIN and the operation or inspection mode. When the input voltage to the VIN terminal 22 is within the range between a first voltage and a second voltage, the photocoupler 80 is in the operation mode, and when it is outside the range, the photocoupler 80 is in the inspection mode. The first voltage is lower than the second voltage, and preferably 0 V or a negative voltage. The first embodiment shown in FIG. 3 and the third embodiment shown in FIG. 6 can be described with reference to FIG. 7.

Specifically, in the first and third embodiment, in the case where there is no ESD protection circuit such as the ESD protection diode 48 between the VIN terminal 22 and the VCC1 terminal 20, the inspection mode is entered if the input voltage VIN is VCC1+VF or more as indicated by hatching. On the other hand, in the case where there is an ESD protection circuit, the range of the inspection mode is further conditioned to be lower than VCC1+VESD.

Furthermore, the second embodiment shown in FIG. 4 and the fourth embodiment shown in FIG. 8 can be described with reference to FIG. 7. Specifically, in the case where there is no ESD protection circuit, the inspection mode is entered if the input voltage VIN is GND1+VB−VF or less as indicated by hatching. Here, for clamping at VIN lower than GND1, the condition VF>VB≧0 is imposed, and VB−VF is negative. On the other hand, in the case where there is an ESD protection diode 48 having a forward voltage of VESD, the inspection mode is further conditioned so that VIN is higher than GND1−VESD. That is, VIN for the inspection mode is given by the range of formula (1):

$$GND1-VESD < VIN \leq GND1+VB-VF \quad (1)$$

In the case where the pn junction is made of silicon, VF and VESD are each near 700 mV.

It is understood from FIG. 7 that the operation mode is entered also in the case where VIN is in the range given by formula (2):

$$VCC1 < VIN < VCC1+VF \quad (2)$$

That is, the second voltage can be set in a range lower than VCC1+VF. However, if the operation mode is contiguous to the inspection mode, a malfunction due to noise and the like is likely to occur. Hence, the input voltage VIN of the digital signal is more preferably VCC1 or less.

Furthermore, it is understood that the operation mode is entered also in the case where VIN is in the range given by formula (3):

$$GND1+VB-VF < VIN < GND1 \quad (3)$$

That is, the first voltage can be set in the range of formula (3) lower than the second voltage. However, if the operation mode is contiguous to the inspection mode, a malfunction due to noise and the like is likely to occur. Hence, the input voltage VIN of the digital signal is more preferably GND1 or more. Thus, the input voltage VIN of the digital signal for the operation mode has a more preferable range Z given by formula (4):

$$GND1 \leq VIN \leq VCC1 \quad (4)$$

where VCC1>0

It is noted that an ESD protection circuit can be provided also in the first embodiment (FIG. 3) and the third embodiment (FIG. 6) in which the inspection mode is set to the power supply side.

In the first to fourth embodiment, there is no need to newly provide a terminal for inspection, the photocoupler 80 can be downsized, analog characteristics such as current sensitivity of the light emitting device 42 can be accurately measured, and the operating margin can be accurately determined. Hence, a photocoupler adapted to the purpose can be easily provided, and the reliability is further improved. Furthermore, a photocoupler such as a signal coupler can be realized with few constraints on its input impedance and the transient characteristics of the power supply. Moreover, the present embodiments can prevent the inspection mode from being entered during the rising and falling of the power supply voltage, and can maintain a wide operating range of the inspection mode even at a low power supply voltage.

The present embodiments have been described in the case where the transistor is a bipolar transistor. However, a field effect transistor (FET) having the same polarity can also be used.

The embodiments of the invention have been described with reference to the drawings. However, the invention is not limited to these embodiments. The layout and configuration of the clamp circuit, drive circuit, drive stop circuit, light emitting device, ESD protection diode, and light receiving section constituting the embodiments of the invention can be modified by those skilled in the art, and such modifications are also encompassed within the scope of the invention as long as they do not depart from the spirit of the invention.

The invention claimed is:

1. A photocoupler comprising:
a light emitting device;
a drive circuit connected to a power supply terminal, an input terminal, and a ground terminal, and configured to drive the light emitting device in accordance with a digital signal inputted to the input terminal and cause the light emitting device to output an optical signal;
a clamp circuit including a first transistor connected to the input terminal; and
a light receiving section configured to convert the optical signal to an electrical signal for output,
for an input voltage to the input terminal being within a range between a first voltage and a second voltage, the photocoupler being allowed to enter an operation mode in which the drive circuit, in response to the digital signal inputted thereto, drives the light emitting device to convert the digital signal to the optical signal, and the electrical signal is externally outputted from the light receiving section, and
for an input voltage to the input terminal being outside the range between the first voltage and the second voltage, the photocoupler being allowed to enter an inspection mode in which the drive circuit stops driving the light emitting device, the first transistor of the clamp circuit is turned on, and a current generally equal or proportional to a clamp current of the clamp circuit is supplied to the light emitting device so that characteristics of the light emitting device can be measured.

2. A photocoupler comprising:
a light emitting device;
a drive circuit connected to a power supply terminal, an input terminal, and a ground terminal, and configured to drive the light emitting device in accordance with a digital signal inputted to the input terminal and cause the light emitting device to output an optical signal;
a clamp circuit having a first transistor connected to the input terminal, and a current mirror circuit made of a second and third transistors to supply with a polarity-inverted current to the light emitting diode, the first transistor and the second transistor connected in series; and
a light receiving section configured to convert the optical signal to an electrical signal for output,
for an input voltage to the input terminal being within a range between a first voltage and a second voltage, the photocoupler being allowed to enter an operation mode in which the drive circuit, in response to the digital signal inputted thereto, drives the light emitting device to convert the digital signal to the optical signal, and the electrical signal is externally outputted from the light receiving section, and
for an input voltage to the input terminal being outside the range between the first voltage and the second voltage, the photocoupler being allowed to enter an inspection mode in which the drive circuit stops driving the light emitting device and a current generally equal or proportional to a clamp current of the clamp circuit is supplied to the light emitting device through the current mirror circuit by turning on the first transistor so that characteristics of the light emitting device can be measured.

3. The photocoupler according to claim 1, wherein
an anode of the light emitting device is connected to the power supply terminal, and
in response to the input voltage being higher than the voltage of the power supply terminal, the photocoupler can enter the inspection mode.

4. The photocoupler according to claim 3, further comprising an ESD protection circuit connected between the input terminal and the power supply terminal, being capable of protecting any of the drive circuit and the clamp circuit.

5. The photocoupler according to claim 4, wherein the ESD protection circuit is based on any of forward characteristics and Zener characteristics of a diode.

6. The photocoupler according to claim 3, further comprising a drive stop circuit provided between the clamp circuit and the drive circuit, being possible to control the drive circuit:
   the drive stop circuit having a fourth transistor constituting the current mirror circuit with the second and third transistors, the fourth transistor to which a current generally equal or proportional to the clamp current is supplied by turning on the first transistor, and
   the drive circuit to which the output voltage of the fourth transistor decreasing by the turning on of the first transistor is inputted being allowed to stop driving the light emitting device.

7. The photocoupler according to claim 2, wherein
   a cathode of the light emitting device is connected to the ground terminal,
   a base voltage of the first transistor is allowed to be set higher than zero and in a range lower than a forward voltage between a base and an emitter of the first transistor, and
   in response to the input voltage being lower than the voltage of the ground terminal, the first transistor is turned on, and the photocoupler can enter the inspection mode.

8. The photocoupler according to claim 7, further comprising an ESD protection circuit connected between the input terminal and the power supply terminal, being capable of protecting any of the drive circuit and the clamp circuit.

9. The photocoupler according to claim 8, wherein the ESD protection circuit is based on any of forward characteristics and Zener characteristics of a diode.

10. The photocoupler according to claim 7, further comprising a drive stop circuit provided between the clamp circuit and the drive circuit, having a fifth transistor being allowed to be turned on almost simultaneously with the first transistor and being possible to control the drive circuit: the drive circuit to which the output voltage of the fifth transistor decreasing by the turning on of the first transistor is inputted being allowed to stop driving the light emitting device.

11. A photocoupler comprising:
    a light emitting device;
    a drive circuit connected to a power supply terminal, an input terminal, and a ground terminal, and configured to drive the light emitting device in accordance with a digital signal inputted to the input terminal and cause the light emitting device to output an optical signal;
    a clamp circuit having a first transistor connected to the input terminal, and allowed to be set higher than zero and in a range lower than a forward voltage between a base and an emitter; and
    a light receiving section configured to convert the optical signal to an electrical signal for output,
    for an input voltage to the input terminal being within a range between a first voltage and a second voltage, the photocoupler being allowed to enter an operation mode in which the drive circuit, in response to the digital signal inputted thereto, drives the light emitting device to convert the digital signal to the optical signal, and the electrical signal is externally outputted from the light receiving section, and
    for an input voltage to the input terminal being outside the range between the first voltage and the second voltage, the photocoupler being allowed to enter an inspection mode in which the drive circuit stops driving the light emitting device, the first transistor is turned on, and a clamp current of the clamp circuit is supplied to the light emitting device so that characteristics of the light emitting device can be measured.

12. The photocoupler according to claim 11, wherein
    an anode of the light emitting device is connected to the power supply terminal, and
    in response to the input voltage being lower than the voltage of the ground terminal, the photocoupler can enter the inspection mode.

13. The photocoupler according to claim 12, wherein the base voltage of the first transistor is allowed to be controlled by series resistors dividing between the voltage of the power supply terminal and the ground terminal.

14. The photocoupler according to claim 12, further comprising an ESD protection circuit connected between the input terminal and the ground terminal, being capable of protecting any of the drive circuit and the clamp circuit.

15. The photocoupler according to claim 14, wherein the ESD protection circuit is based on any of forward characteristics and Zener characteristics of a diode.

16. The photocoupler according to claim 12, further comprising a drive stop circuit provided between the clamp circuit and the drive circuit, having a sixth transistor being controllable by the base voltage of the first transistor and being possible to control the drive circuit:
    the drive circuit having a signal of the decreased output voltage of the sixth transistor inputted is allowed to stop driving the light emitting device.

17. The photocoupler according to claim 1, wherein
    a cathode of the light emitting device is connected to the ground terminal, and
    in response to the input voltage being higher than the voltage of the power supply terminal, the photocoupler can enter the inspection mode.

18. The photocoupler according to claim 17, further comprising an ESD protection circuit connected between the input terminal and the power supply terminal, being capable of protecting any of the drive circuit and the clamp circuit.

19. The photocoupler according to claim 18, wherein the ESD protection circuit is based on any of forward characteristics and Zener characteristics of a diode.

20. The photocoupler according to claim 17, further comprising a drive stop circuit provided between the clamp circuit and the drive circuit, having a seventh transistor being allowed to be turned on almost simultaneously with the first transistor and being possible to control the drive circuit:
    the drive circuit to which the output voltage of the seventh transistor increasing by the turning on of the first transistor is inputted being allowed to stop driving the light emitting device.

* * * * *